United States Patent
Li

(10) Patent No.: US 9,641,184 B2
(45) Date of Patent: *May 2, 2017

(54) COMPENSATION FOR DIGITALLY CONTROLLED OSCILLATOR APPARATUS AND METHOD

(71) Applicant: Intel Corporation, Santa Clara, CA (US)

(72) Inventor: Shenggao Li, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/728,877

(22) Filed: Jun. 2, 2015

(65) Prior Publication Data
US 2015/0263741 A1     Sep. 17, 2015

Related U.S. Application Data

(63) Continuation of application No. 13/997,589, filed as application No. PCT/US2011/060068 on Nov. 9, 2011, now Pat. No. 9,071,253.

(51) Int. Cl.
| | |
|---|---|
| *H03L 7/00* | (2006.01) |
| *H03L 7/099* | (2006.01) |
| *H03B 1/00* | (2006.01) |
| *H03L 1/00* | (2006.01) |
| *H03L 7/10* | (2006.01) |
| *H03L 7/16* | (2006.01) |

(52) U.S. Cl.
CPC ............ *H03L 7/0991* (2013.01); *H03B 1/00* (2013.01); *H03L 1/00* (2013.01); *H03L 7/099* (2013.01); *H03L 7/104* (2013.01); *H03L 7/16* (2013.01); *H03L 2207/06* (2013.01); *H03L 2207/50* (2013.01)

(58) Field of Classification Search
CPC ... H03B 1/00; H03B 2201/0208; H03L 7/099; H03L 7/0991; H03L 7/104; H03L 7/16; H03L 2207/06; H03L 2207/50; H03L 1/00
USPC .... 331/57, 34, 1 A, 16, 179, 177 V, 117 FE, 331/117 R, 167, 36 C
See application file for complete search history.

(56) References Cited

U.S. PATENT DOCUMENTS

| | | | |
|---|---|---|---|
| 9,071,253 B2 * | 6/2015 | Li | ............................ H03B 1/00 |
| 2003/0206042 A1 | 11/2003 | Walker et al. | |
| 2006/0071728 A1 | 4/2006 | Chen | |

(Continued)

OTHER PUBLICATIONS

International Search Report and Written Opinion for PCT/US2011/060068, mailed May 14, 2012, 6 pages.

(Continued)

*Primary Examiner* — Arnold Kinkead
(74) *Attorney, Agent, or Firm* — Schwabe, Williamson & Wyatt, P.C.

(57) ABSTRACT

Automatic digital sensing and compensation of frequency drift caused by temperature, aging, and/or other effects may be provided by including a compensation capacitor array and a sensing logic. The sensing logic may be configured to detect a drift in a first control signal and to provide the compensation capacitor array with a second control signal. The second control signal is configured to cause an adjustment of capacitance in the compensation capacitor array based on the detected drift in the first control signal.

17 Claims, 4 Drawing Sheets

(56) References Cited

U.S. PATENT DOCUMENTS

| | | |
|---|---|---|
| 2007/0194811 A1 | 8/2007 | Nitsche et al. |
| 2008/0129398 A1* | 6/2008 | Sun .......................... H03L 7/10 |
| | | 331/117 FE |
| 2011/0128080 A1 | 6/2011 | Wennekers et al. |
| 2011/0227615 A1* | 9/2011 | Faison .................... H03L 7/099 |
| | | 327/157 |

OTHER PUBLICATIONS

International Preliminary Report on Patentability for PCT Application No. PCT/US2011/060068, dated May 22, 2014.
Non-Final Office Action mailed Sep. 18, 2014 for U.S. Appl. No. 13/997,589, 16 pages.
Notice of Allowance mailed Mar. 4, 2015 for U.S. Appl. No. 13/997,589, 5 pages.

\* cited by examiner

200

201 — @(init):
FCW = 0; CompCW = 0

@time(n): {

203 — % regular PLL loop control,
FCW(n)= FCW(n-1) + digital_loop_filter_out(n) - digital_loop_filter_out(n-1);

205 — % signal to pass through a filter to determine if FCW(n) is beyond the threshold
% note that filter processes k previous samples of FCW(n)
% corrections are made to FCW(n) and CompCW as needed (generic algorithm)
If (abs (Low_Pass_Filter (FCW(n)..FCW (n-k) > FCW_TH) {

207 — % shift CompCW in the same direction by 1 LSB
CompCW(n) = CompCW(n-1) + sign(FCW(n)) * CompCW_LSB;

209 — % shift FCW(n) in the opposite direction by m*FCW_LSB
FCW(n) = FCW(n) – sign(FCW(n)) * m * FCW_LSB;
} %% output FCW(n) to the fine control capacitor array
output FCW(n);

COMPENSATION FOR DIGITALLY CONTROLLED OSCILLATOR APPARATUS AND METHOD

CROSS REFERENCE TO RELATED APPLICATION

The present application claims priority to U.S. patent application Ser. No. 13/997,589, filed Jun. 24, 2013, which issued as U.S. Pat. No. 9,071,253, and which claims priority to national phase entry under 35 U.S.C. §371 of International Application No. PCT/US2011/060068, filed Nov. 9, 2011, entitled "COMPENSATION FOR DIGITALLY CONTROLLED OSCILLATOR APPARATUS AND METHOD", which designates, among the various States, the United States of America, and the entire contents and disclosures of which are hereby incorporated by reference in their entireties.

TECHNICAL FIELD

This disclosure relates generally to electronic circuits. More particularly but not exclusively, the present disclosure relates to automatic digital sensing and compensation of frequency drift.

BACKGROUND INFORMATION

In ring oscillators and inductance-capacitance voltage-controlled oscillators (LC-VCO), temperature drift is often solved by using temperature sensing and compensation circuits. For example, typical VCO implementations may use a Proportional to Absolute Temperature (PTAT) circuit to counter temperature drift of oscillator cores. In another example, a silicon chip with on-die temperature sensors may use a temperature sensor code as a mechanism to compensate for temperature drift. In the above approaches, temperature compensation is an open-loop mechanism, thereby requiring careful device characterization and post-silicon trimming.

In contrast, a closed-loop approach might include detecting a control voltage of the oscillator. If the control voltage is too far from a preset operating point, an error signal can be fed back to adjust common-mode inputs of a varactor coupled to the LC-VCO, thereby forcing the control voltage to the preset voltage. This implementation in the analog domain, however, can be costly due to various reasons.

Another approach is to provide no compensation at all, in which case frequency coverage range of a fine-tuning curve is simply extended. In the case of a digitally controlled oscillator (DCO), however, this may mean longer fine-tuning word length, thereby potentially incurring higher logic power consumption.

BRIEF DESCRIPTION OF THE DRAWINGS

Non-limiting and non-exhaustive embodiments are described with reference to the following figures, wherein like reference numerals refer to like parts throughout the various views unless otherwise specified.

FIG. 2 illustrates a method performed by a sensing logic coupled to the compensation capacitor array of FIG. 1, in accordance with embodiments.

DETAILED DESCRIPTION

Embodiments for a method and apparatus for automatic digital sensing and compensation of frequency drift caused by temperature, aging, and/or other effects are described herein. In embodiments, a compensation capacitor array coupled to a sensing logic in a digitally controlled oscillator (DCO) may be included in an all-digital phase locked loop. Although the embodiments are described in context of a phase locked loop, other suitable circuit configurations are also contemplated.

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
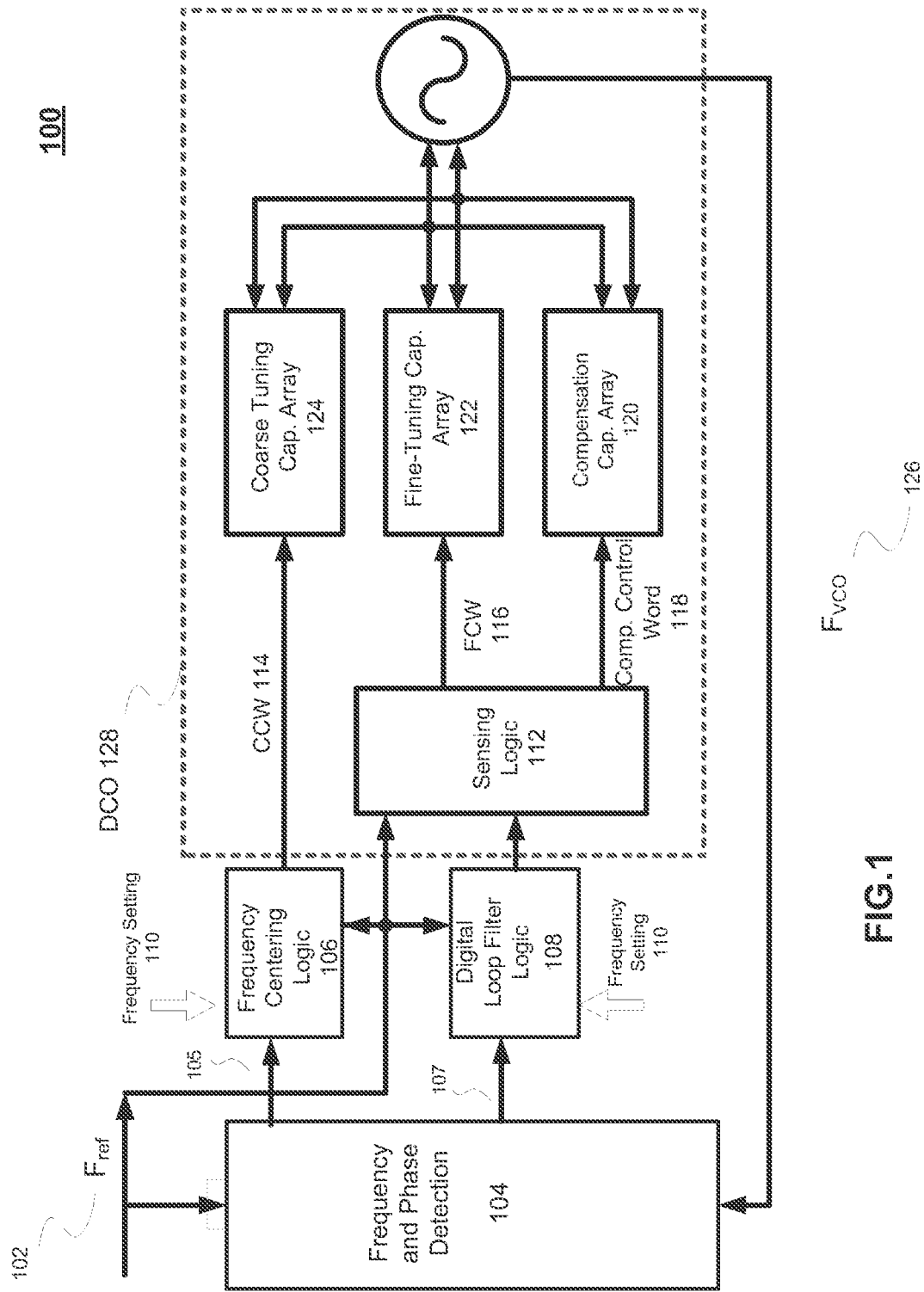
FIG. 1 illustrates an example of a digital phase locked loop including a compensation capacitor array in accordance with embodiments.

FIG. 1 illustrates a phase-locked loop (PLL) circuit 100 in accordance with one embodiment. In the embodiment, PLL circuit 100 is an all-digital PLL that has an architecture that includes a frequency and phase detection circuit 104, frequency centering logic 106, and digital loop filter logic 108, each coupled to a digitally controlled oscillator (DCO) 128. In various embodiments, DCO 128 may include an inductance-capacitance (LC) based DCO or ring-based DCO. In embodiments, DCO 128 may include a sensing logic 112 coupled to a respective first and second capacitor array, such as for example, compensation capacitor array 120 and fine-tuning capacitor array 122. DCO 128 also includes a third capacitor array such as a coarse-tuning capacitor array 124.

In embodiments, compensation capacitor array 120 may compensate for temperature and aging effects on PLL circuit 100. In embodiments, compensation capacitor array 120 may include a number of m fine-tuning capacitor arrays similar or identical to fine-tuning capacitor array 122. Note that in embodiments, PLL circuit 100 may provide a reference clock signal, $F_{ref}$ 102, to frequency and phase detection circuit 104, which may in turn provide signals beginning along a respective upper path 105 and lower path 107. In embodiments, upper path 105 may be included in a coarse-tuning path and lower path 107 included in a fine-tuning as well as aging and/or temperature compensation path for re-centering a frequency of DCO 128. Thus, as can be seen from FIG. 1, frequency and phase detection circuit 104 may receive reference clock signal $F_{ref}$ 102 and a feedback signal $F_{vco}$ 126 from DCO 128. Accordingly, frequency and phase detection circuit 104 may compare reference clock signal $F_{ref}$ 102 to feedback signal $F_{vco}$ 126 and output a signal along upper path 105 which includes a difference between feedback signal $F_{vco}$ 126 and a target frequency, $F_{ref}*m$, to frequency centering logic 106. Target frequency, $F_{ref}*m$ may be associated with re-centering the frequency of DCO 128 to a center operating point of PLL circuit 100.

As noted above, compensation capacitor array 120 may include a number of m fine-tuning capacitor arrays similar or identical to fine-tuning capacitor array 122. Note that in embodiments, m may be programmable at a frequency setting 110 in FIG. 1. Accordingly, in embodiments, based at least in part on a signal received from frequency and phase detection circuit 104, frequency centering logic 106 provides coarse-tuning capacitor array 124 with a control signal or coarse control word (CCW) 114. In embodiments, CCW 114 may be configured to control an enabling or disabling of capacitors in coarse-tuning capacitor array 124 to bring feedback signal $F_{vco}$ 126 closer to target frequency $F_{ref}*m$. In various embodiments, frequency centering logic 106 may determine CCW 114 through a linear search or a binary search algorithm. Note that in embodiments, CCW 114 may remain fixed after a calibration, unless frequency setting 110 is changed. In embodiments, coarse-tuning capacitor array 124 may provide coarse frequency tuning by cancelling process-voltage-temperature variation during operation of PLL circuit 100.

According to the embodiment shown, fine frequency tuning and temperature and/or aging compensation may be accomplished along a flow including lower path 107 of PLL circuit 100. In embodiments, frequency and phase detection circuit 104 may compare a phase of feedback signal $F_{vco}$ 126 to a phase of reference clock signal $F_{ref}$ 102. In embodiments, a phase difference may be included in a signal transmitted via digital loop filter logic 108 to sensing logic 112. In embodiments, using the received signal, sensing logic 112 may determine a fine control word ("FCW") 116 and a compensation control word ("comp. control word") 118. Sensing logic 112 may then provide FCW 116 to fine-tuning capacitor array 122 and comp. control word 118 to compensation capacitor array 120. In embodiments, FCW 116 may be configured to allow fine-tuning capacitor array 122 to correct a phase difference by enabling or disabling a number of capacitors in fine-tuning capacitor array 122 to adjust capacitance.

Similarly, in embodiments, comp. control word 118 may be configured to cause an adjustment of capacitance in compensation capacitor array 120 by enabling or disabling a number of capacitors in compensation capacitor array 120. In embodiments, comp. control word 118 may be based on a detected drift in FCW 116. In embodiments, if FCW 116 at time n ("FCW (n)") has drifted away from a value or code associated with a center operating point of PLL circuit 100 and stays beyond a threshold ("FCW_TH") toward a negative or positive direction, one or more capacitors in compensation capacitor array 120 may be enabled or disabled so that a next FCW may be shifted back toward the center operating point. Thus, in embodiments, sensing logic 112 includes a drift sensing and decision-making circuit and may execute an algorithm such as for example, a method or algorithm 200 as shown in FIG. 2.

Thus, as shown in the embodiment of FIG. 2, at initialization 201, a current comp. control word ("CompCW" in FIG. 2) and a current fine control word ("FCW") may be initialized to a code associated with a center operating point, e.g., 0. Next, at 203, for the embodiment, a fine control word at a time n, FCW(n) may be calculated by adding to a previous FCW ("FCW(n−1)"), a difference between a current digital loop filter output and a previous digital loop filter output from digital loop filter logic 108. If at 205, determined by passing through a low pass filter, an absolute value of FCW(n) is greater than a fine control word threshold, FCW_TH, then at 207, CompCW(n) may be shifted in a positive or negative direction in a same direction as a sign of FCW(n) by at least one least significant bit (LSB) in the embodiment. Note that the low pass filter may process k previous samples of FCW(n). As noted previously, in an embodiment, to cover temperature and aging drift, compensation capacitor array 120 may include m identical fine-tuning capacitor arrays. Therefore, in embodiments, a least significant bit of CompCW, "CompCW_LSB," may be equivalent to m*FCW_LSB. Thus, in embodiments, at 209, FCW(n) may be updated by shifting FCW(n) in an opposite direction of the sign of FCW(n) by m*FCW_LSB. Note that in embodiments, the low pass filter may suppress high-frequency noise. Thus, in embodiments, if FCW(n) remains beyond FCW_TH for a certain period of time, an adjustment to compensation capacitor array 120 may be needed.

Figure 3:
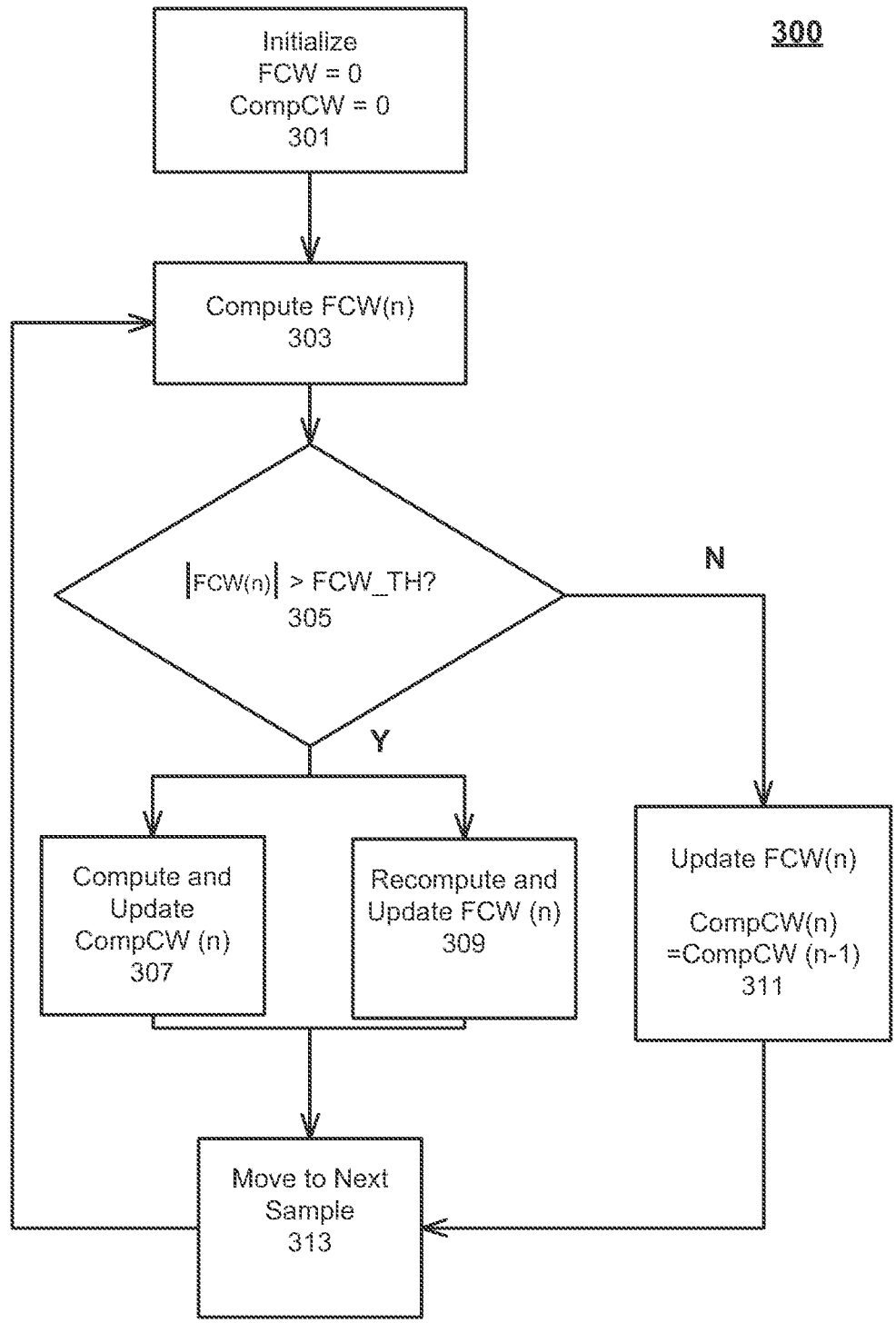
FIG. 3 is a flow diagram further illustrating the method of FIG. 2.

The method of FIG. 2 may also be illustrated in a simplified flow diagram 300 of FIG. 3. Thus, beginning at 301, according to embodiments, a current FCW and CompCW may be initialized to 0. In the embodiment shown, at a next block 303, FCW (n) may be calculated according to an equation as shown in FIG. 2, such as, for example, FCW (n)=FCW (n−1)+digital_loop_filter_out (n)−digital_loop_filter_out (n−1). The flow then may move to a next decision block 305. In the embodiment, if |FCW (n)|>FCW_TH, the flow diagram branches to blocks 307 and 309. In block 307, CompCW(n) may be computed and updated. Thus, CompCW(n) may be shifted in a positive or negative direction according to a sign of FCW(n). Thus, in the embodiment, as shown in FIG. 2 at 207, CompCW(n)=CompCW(n−1)+sign (FCW(n))*CompCW_LSB. Accordingly, for the embodiment, at block 309, FCW(n) may be computed and updated by shifting FCW(n) in an opposite direction of the sign of FCW(n), according to an equation such as FCW (n)=FCW (n)−sign (FCW(n))*m*FCW_LSB. In the embodiment, the flow from block 307 and 309 may then move to block 313 where current time n then becomes previous time n. In the embodiment, the flow moves to a next sample and then loops again to block 303 to begin an iteration to compute FCW and CompCW for a next time where (n→n+1).

Note that in the embodiment shown, if |FCW (n)| is not greater than FCW_TH, then the answer at decision block 305 is No and the flow moves to block 311 where FCW (n) and CompCW (n) may remain static. Accordingly, FCW(n) may be set to a previous FCW, also referred to as, FCW(n−1). In embodiments, CompCW(n) may then also be set to previous comp. control word, also referred to as CompCW (n−1). In the embodiment, the flow from block 311 may then move to block 313 for a next sample.

Thus, instead of relying on temperature detection using temperature sensors, embodiments may take one or more of temperature drift and aging into consideration by analyzing a fine control word for a fine-tuning capacitor array or FCW 116 of FIG. 1. Thus, embodiments may provide automatic digital sensing and compensation of frequency drift caused by temperature, aging, and/or other effects. The drift in FCW 116 may be detected and compared against a preset threshold such as a digital code and based on a deviation from the present threshold, corresponding adjustment may be made to compensation capacitor array 120. In embodiments, this implementation may occur entirely in a digital domain by adding a sensing logic 112 and compensation capacitor array 120 to PLL circuit 100. In embodiments, sensing logic 112 may be included in digital loop filter logic 108. Note that the method of FIG. 2 and FIG. 3 describe only one example of an algorithm that may be used to implement embodiments and that other permutations of the algorithm are also contemplated. Further note that the methods of FIGS. 2 and 3, along with the matching between compensation capacitor array 120 and fine-tuning capacitor array 122 may ensure that significant disturbance to output frequency of feedback signal $F_{vco}$ 126 (e.g., clock jitter) will not occur.

Figure 4:
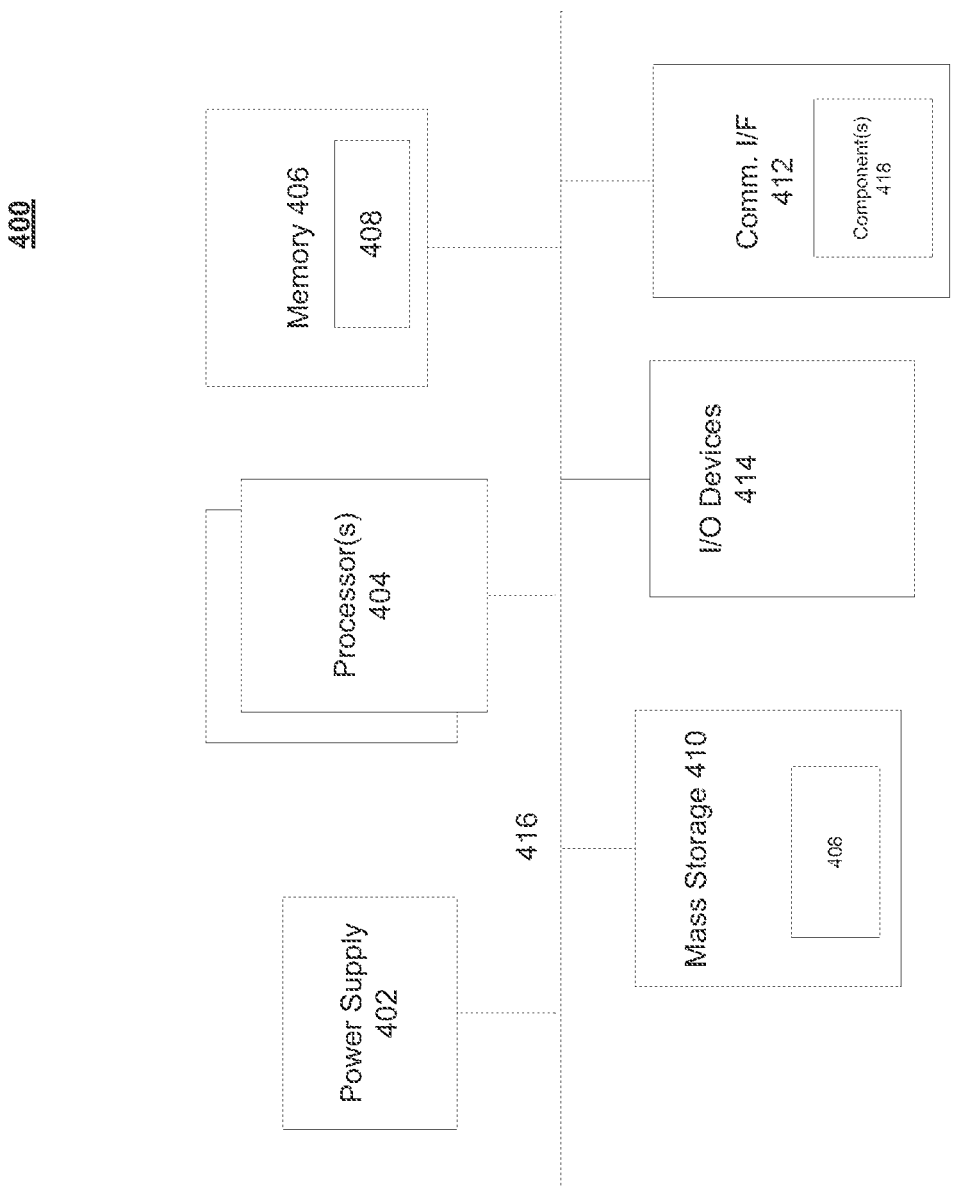
FIG. 4 is a block diagram that illustrates an example computer system suitable to practice the disclosed compensation capacitor array according to methods of various embodiments.

Embodiments of automatic digital sensing and compensation of frequency drift by compensation capacitor array 120 and sensing logic 112 may be used in a number of implementations and applications. FIG. 4 is a block diagram that illustrates an example computer system 400 suitable to practice the disclosed compensation capacitor array and sensing logic of various embodiments.

As shown, computer system 400 may include a power supply unit 402, a number of processors or processor cores 404, a memory 406 having processor-readable and processor-executable instructions 408 stored therein, a mass storage device 410 that may also store the instructions 408, and a communication interface 412 including components 418. For the purpose of this application, including the claims, the terms "processor" and "processor cores" may be considered synonymous, unless the context clearly requires otherwise.

In various embodiments of the present disclosure, at least one of the processors 404 may include or be configured to control a detection circuit and a compensation capacitor array wherein the detection circuit may detect a drift in a control word to adjust a second control word to adjust capacitance in the compensation capacitor array based on the detected drift in the first control word.

The one or more mass storage devices 410 and/or the memory 406 may comprise a tangible, non-transitory computer-readable storage device (such as a diskette, hard drive, compact disc read only memory (CDROM), hardware storage unit, and so forth). The computer system 400 may also comprise input/output devices 414 (such as a keyboard, display screen, cursor control, and so forth). In various embodiments, the communication interface 412 may include electronic component(s) 418 that may include a compensation capacitor array and sensing logic configured to compensate for temperature and/or aging effects on a circuit and as described in accordance with FIGS. 1-3. Such component(s) 418 may alternatively or additionally be located elsewhere in the computer system 400, and may comprise part or all of an integrated circuit.

The various elements of FIG. 4 may be coupled to each other via a communication pathway 416, which may represent a multi-drop bus or a point-to-point interconnect. In the case of multiple buses, they may be bridged by one or more bus bridges (not shown). Data may pass through the system bus 416 through the I/O devices 414, for example, between the component(s) 418 and the processors 404.

The memory 406 and the mass storage device 410 may be employed to store a working copy and a permanent copy of the programming instructions implementing one or more operating systems, firmware modules or drivers, applications, and so forth, herein collectively denoted as 408. The permanent copy of the programming instructions may be placed into permanent storage in the factory, or in the field, through, for example, a distribution medium (not shown), such as a compact disc (CD), or through the communication interface 412 (from a distribution server (not shown)).

The remaining constitution of the various elements of the computer system 400 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been described above in the context of a phase-locked loop. In other embodiments, different configurations can be provided in view of a design of type of circuit that is to receive temperature, aging, or other compensation.

These and other modifications can be made in light of the above detailed description. The terms used in the following claims should not be construed to be limited to the specific embodiments disclosed in the specification.

What is claimed is:

1. An apparatus, comprising:
   a first capacitor array;
   a sensing logic coupled to the first capacitor array, the sensing logic to detect a drift in a first control signal and to provide the first capacitor array with a second control signal, wherein the second control signal is to cause an adjustment of a capacitance in the first capacitor array based on the detected drift in the first control signal; and
   a digital loop filter logic coupled to provide a phase difference to the sensing logic.

2. The apparatus of claim 1, wherein the first capacitor array is configured to compensate for temperature or aging in a phase-locked loop.

3. The apparatus of claim 1, further comprising:
   a second capacitor array to receive the first control signal and to provide fine frequency tuning in a phase-locked loop.

4. The apparatus of claim 1, further comprising:
   a third capacitor array coupled to receive a third control signal to enable or disable capacitors in the third capacitor array to provide coarse frequency tuning.

5. The apparatus of claim 1, wherein the second control signal is configured to cause the adjustment of capacitance in the first capacitor array by enabling or disabling capacitors in the first capacitor array.

6. The apparatus of claim 1, wherein the sensing logic is configured to detect the drift in the first control signal based at least in part on a deviation from a threshold.

7. The apparatus of claim 1, wherein the sensing logic is included in the digital loop filter logic.

8. The apparatus of claim 1, wherein the first capacitor array includes a plurality of fine-tuning capacitor arrays identical to a second capacitor array coupled to the sensing logic.

9. An apparatus, comprising:
   means for detecting a drift in a first control word by detecting a frequency deviation from a center of a fine-tuning curve; and
   means for, based at least in part on the detected drift, adjusting a second control word to be provided to a first capacitor array to cause an adjustment in capacitance based on the detected drift in the first control word; and
   means for receiving, by a detection circuit, a digital output signal from a digital loop filter logic to indicate a phase difference.

10. The apparatus of claim 9, wherein the adjustment in capacitance is to re-center a frequency of a digitally controlled oscillator that includes the first capacitor array.

11. The apparatus of claim 9, further comprising:
means for providing the first control word to a second capacitor array to cause fine frequency tuning in the second capacitor array.

12. The apparatus of claim 9, wherein the means for detecting and the means for adjusting are included in an all-digital phase locked loop.

13. A system, comprising:
a processor;
a communication interface coupled to the processor, the communication interface including:
  a first capacitor array;
  a second capacitor array;
  a sensing logic coupled to the first capacitor array and the second capacitor array, the sensing logic to:
    detect a drift in a first control word; and
    based at least in part on the detected drift, adjust a second control word to be provided to the first capacitor array to cause an adjustment in capacitance based on the detected drift in the first control word; and
  a digital loop filter logic coupled to provide a signal indicating a phase difference to the sensing logic to determine the first control word;
wherein the first capacitor array, the second capacitor array, and the sensing logic are included in an all-digital phase-locked loop.

14. The system of claim 13, further comprising:
a third capacitor array in the all-digital phase-locked loop to provide coarse frequency tuning.

15. The system of claim 14, wherein the third capacitor array is to provide the coarse frequency tuning by cancelling process-voltage-temperature variation.

16. An apparatus, comprising:
a first capacitor array;
a sensing logic coupled to the first capacitor array, the sensing logic to detect a drift in a first control signal and to provide the first capacitor array with a second control signal, wherein the second control signal is to cause an adjustment of a capacitance in the first capacitor array based on the detected drift in the first control signal; and
a digital loop filter logic coupled to provide a phase difference to the sensing logic to enable the sensing logic to determine the first control signal;
wherein the first capacitor array includes a plurality of fine-tuning capacitor arrays that are the same as a second capacitor array coupled to the sensing logic.

17. The apparatus of claim 16, further comprising:
a third capacitor array coupled to the sensing logic to receive a third control signal to enable or disable capacitors in the third capacitor array to provide coarse frequency tuning.

* * * * *